(12) United States Patent
Iraha et al.

(10) Patent No.: US 7,880,525 B2
(45) Date of Patent: Feb. 1, 2011

(54) SIGNAL PROCESSING DEVICE HAVING A VARIABLE CURRENT SOURCE

(75) Inventors: Tomoyuki Iraha, Kanagawa (JP); Noriaki Matsuno, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 6 days.

(21) Appl. No.: 12/385,843

(22) Filed: Apr. 21, 2009

(65) Prior Publication Data

US 2009/0261881 A1 Oct. 22, 2009

(30) Foreign Application Priority Data

Apr. 22, 2008 (JP) .............................. 2008-110919

(51) Int. Cl.
*H03L 5/00* (2006.01)
(52) U.S. Cl. ........................ 327/307; 455/296; 455/341
(58) Field of Classification Search ................. 327/307; 455/296, 334, 341
See application file for complete search history.

(56) References Cited

U.S. PATENT DOCUMENTS

| 7,565,127 B2 * | 7/2009 | Tokairin et al. | ............. | 455/296 |
| 2003/0214423 A1 * | 11/2003 | Lee et al. | ..................... | 341/118 |

2008/0090545 A1 4/2008 Tokairin et al.

FOREIGN PATENT DOCUMENTS

| JP | 2001-156566 | 6/2001 |
| WO | WO 2005/112282 | 11/2005 |

* cited by examiner

*Primary Examiner*—Lincoln Donovan
*Assistant Examiner*—William Hernandez
(74) *Attorney, Agent, or Firm*—McGinn IP Law Group, PLLC

(57) ABSTRACT

A signal processing device suppresses a DC offset without omission of a low-frequency component of a signal in a receiver in a direct conversion system. The signal processing device includes an input terminal 29, a gain amplifier 31 that amplifies an input signal to generate an output signal, comparators 32 and 33 each of which compares an output signal level with a reference value, a capacitor 37, current source circuits 34 and 35, one of which charges or discharges electric charges stored in the capacitor when the output signal level falls outside a reference range according to results of comparisons by the comparators, a variable current source 36 through which current to be flow is controlled according to a potential at the capacitor, and a load circuit 38 that is connected between the input terminal and the variable current source and supplies a bias to the input terminal, together with the variable current source. When the output signal level falls within the reference voltage, the bias at the input terminal does not vary. Thus, a low-frequency component of the input signal is not omitted.

12 Claims, 20 Drawing Sheets

SIGNAL PROCESSING DEVICE HAVING A VARIABLE CURRENT SOURCE

REFERENCE TO RELATED APPLICATION

This application is based upon and claims the benefit of the priority of Japanese patent application No. 2008-110919 filed on Apr. 22, 2008, the disclosure of which is incorporated herein in its entirety by reference thereto.

FIELD OF THE INVENTION

The present invention relates to a signal processing device in a direct conversion system or the like. More specifically, the invention relates to a signal processing device that suppresses a DC offset and amplifies a signal.

BACKGROUND

A common configuration of a conventional receiver in the direct conversion system will be shown in FIG. 1. An RF signal received through an antenna is supplied to an input terminal 1, and is then amplified by a low noise amplifier (Low Noise Amplifier; hereinafter referred to as an LNA) 2. Then, the amplified signal is branched into two paths. The branched signals are respectively down-converted by down-conversion mixers (hereinafter referred to as mixers) 3a and 3b on the respective paths. In this case, local signals (hereinafter referred to as LO signals) cos ωt and sin ωt having a phase difference of 90 degrees to each other, supplied from local signal input terminals 4a and 4b are selected so that a frequency of each of the LO signals cos ωt and sin ωt is the same as a carrier frequency of a desired RF signal. With this arrangement, a baseband signal is obtained by one time down-conversion.

Baseband signals output from the mixers 3a and 3b are respectively converted to digital signals through gain variable amplifiers 5a and 5b, 7a and 7b, low-pass filters (hereinafter referred to as LPFs) 6a and 6b for channel selection, and analog/digital converters (hereinafter referred to as ADCs) 8a and 8b. The digital signals obtained by the conversion are processed at a baseband signal processing unit (BB) 9.

A gain control unit (gain setting unit) 10 controls gains of results obtained by the processing in respective stages of the LNA2 and the gain variable amplifiers 5a, 5b, 7a, and 7b, if necessary, based on a time slot, bit error rate data, a reception strength, and the like of a received signal.

In the receiver in the direct conversion system described above, the baseband down-conversion is performed before components other than channel signals are filtered. Thus, in view of the presence of an interference wave, a sufficient gain cannot be obtained in a stage before the mixers 3a and 3b. Accordingly, the intensities of desired waves after the down-conversion are basically weak. A DC offset influence on each of the outputs of the mixers 3a and 3b is relatively large.

It is known that DC offsets are generated by some mechanisms other than a DC level drift of each of the outputs of the mixers 3a and 3b caused by variations in elements. Principal ones of the DC offsets will be shown in FIGS. 2 to 5.

FIG. 2 shows a DC offset generated by LO signal self mixing of an LO signal to be supplied through a local signal input terminal 4, which makes a detour to an RF port of a mixer 3 through a path 11 due to leakage or the like. This is a so-called static offset that does not vary with time.

FIG. 3 shows a DC offset generated by the LO signal to be supplied from the local signal input terminal 4. The LO signal passes through a path 12, and makes a detour to the RF port of the mixer 3 from the input terminal 1 of the LNA2, thereby generating the DC offset. An amount of the DC offset varies depending on gain setting of the LNA 2. Accordingly, at a time gain setting of the LNA2 immediately after reception, the amount of the DC offset varies. Further, the LO signal that has made a detour to the input terminal 1 of the LNA 2 may flow back to the antenna, and may be radiated into the space. Then, the LO signal may return to the LNA 2 and the mixer 3 through the antenna again. In this case, the DC offset is a dynamic offset that varies according to a change in an ambient environment.

FIG. 4 shows a DC offset caused by self mixing of an RF signal. The DC offset is generated by supply of a portion of the RF signal received through the antenna to the LO signal port 4 of the mixer 3 through a path 13. This DC offset noticeably occurs when there is a strong interference wave in a frequency band in the vicinity of the desired RF signal. The reception strength of the interference wave is varied by an influence such as fading. Thus, this DC offset is a dynamic offset.

FIG. 5 shows a DC offset generated by a portion of the RF signal amplified by the LNA 2. The portion of the RF signal makes a detour to the LO signal input terminal 4 of the mixer 3 through a path 14. The DC offset has both a dynamic DC offset property caused by the fading or the like and a property of a stepwise DC offset variation caused by a gain change in the LNA 2. In addition to the fading and the gain change in the LNA2, a second order distortion of the mixer 3 also varies the DC offset.

When the DC offset generated by one of the mechanisms described above is supplied to each of the gain variable amplifiers 7a and 7b, an amount of the DC offset is amplified. Generally, gain variable amplifiers perform amplification of several times to several thousand times. Thus, the amount of the DC offset is also amplified several times to several thousand times. In each of the gain variable amplifiers 7a and 7b, the amplified DC offset becomes a DC voltage bias level that has not been assumed at a time of designing. Then, the gain variable amplifiers 7a and 7b are brought into an inoperable state. Signal processing cannot be thereby performed.

Accordingly, a circuit for suppressing an increase in the DC offset is necessary for a receiver in the direct conversion system. As prior arts that suppress a DC offset in the receiver in this direct conversion system, Patent Documents 1 and 2 listed below are disclosed.

FIG. 6 shows a diagram illustrating a configuration of a gain control circuit described in Patent Document 1. This circuit has a configuration in which an output of a gain control amplifier 16 is fed back to a subtractor 19 on an input side through an amplifier 17 and an integrator 18, thereby reducing a DC gain. In this circuit, by controlling a gm (transconductance) value of the integrator 18 so that the DC gain becomes constant according to gain control of the gain control amplifier 16, a DC offset variation in a gain control circuit 20 at a time of gain control can be reduced.

FIG. 7 shows a diagram illustrating a configuration of a signal processing device described in Patent Document 2. An input signal to this circuit is supplied to a high-pass filter (hereinafter referred to as an HPF) 23 from a terminal 21. An output of the HPF 23 is branched into inputs to an output terminal 22 and an LPF 25. When a DC offset voltage of the output of the HPF 23 exceeds a voltage set by a determination element 26 in advance, a switch 28 is turned ON, thereby connecting an output node of the HPF 23 to the ground to discharge electric charges. When the electric charges are discharged, an output DC level of the HPF 23 is reduced, so that the DC offset voltage is suppressed. On the contrary, when the DC offset voltage falls below the voltage set by the determination element 26 in advance, a switch 27 is turned ON, thereby connecting the output node of the HPF 23 to a power supply to charge electric charges. When the electric charges are charged, the DC level is increased, so that the DC offset voltage is suppressed.

[Patent Document 1]
 JP Patent Kokai Publication No. JP-P-2001-156566A

[Patent Document 2]
 International Publication No. WO2005/112282 pamphlet

SUMMARY OF THE DISCLOSURE

The entire disclosures in the above-mentioned Patent Documents 1 and 2 are incorporated herein by reference thereto.

In the above-mentioned prior arts described in FIGS. 6 and 7, the DC offset is cancelled. Thus, even when the DC offset falls within a predetermined range, low-frequency component omission occurs.

That is, in the circuit shown in FIG. 6, a baseband signal supplied from an input terminal and output from an output terminal is fed back. "DC offset suppression" and "omission of a low-frequency component of the baseband signal" are in a tradeoff relationship. Accordingly, when the "DC offset suppression" is to be sufficiently performed, the "omission of a low-frequency component of the baseband signal" occurs. Further, by feeding back the baseband signal itself, noises caused by the amplifier 17 and the integrator 18 are fed back to an input signal. Thus, a noise figure (hereinafter referred to as an NF) may deteriorate.

In the circuit in FIG. 7, the HPF 23 is employed. Thus, omission of a low-frequency component of the input signal supplied to the input terminal 21 occurs. A lower limit of the passing frequency band of the HPF may be extended to a low frequency band. However, for doing so, the chip area is increased, and an increase in the cost is thereby brought about.

As described above, a signal processing device that suppresses a DC offset without bringing about omission of a low-frequency component is desired.

A signal processing device according to an aspect of the present invention is configured by including:

an input terminal that receives an input signal;

an amplifier that amplifies the input signal to generate an output signal;

a comparator that compares a level of the output signal with a reference value;

a capacitor;

a charger/discharger that charges or discharges electric charges stored in the capacitor according to a result of the comparison by the comparator when the level of the output signal falls outside a reference range;

a variable current source through which current to be flown is controlled according to a potential at the capacitor; and a load circuit that is connected between the input terminal and the variable current source and supplies a bias to the input terminal, together with the variable current source.

According to the present invention, when the level of the output signal falls within the reference range, the current that flows through the variable current source is also constant. The bias at the input terminal does not vary, and a DC component of the input signal is not therefore omitted.

The above features and advantages of the present invention will be more apparent from the following description of certain preferred embodiments taken in conjunction with the accompanying drawings.

PREFERRED MODES OF THE INVENTION

Figure 1:
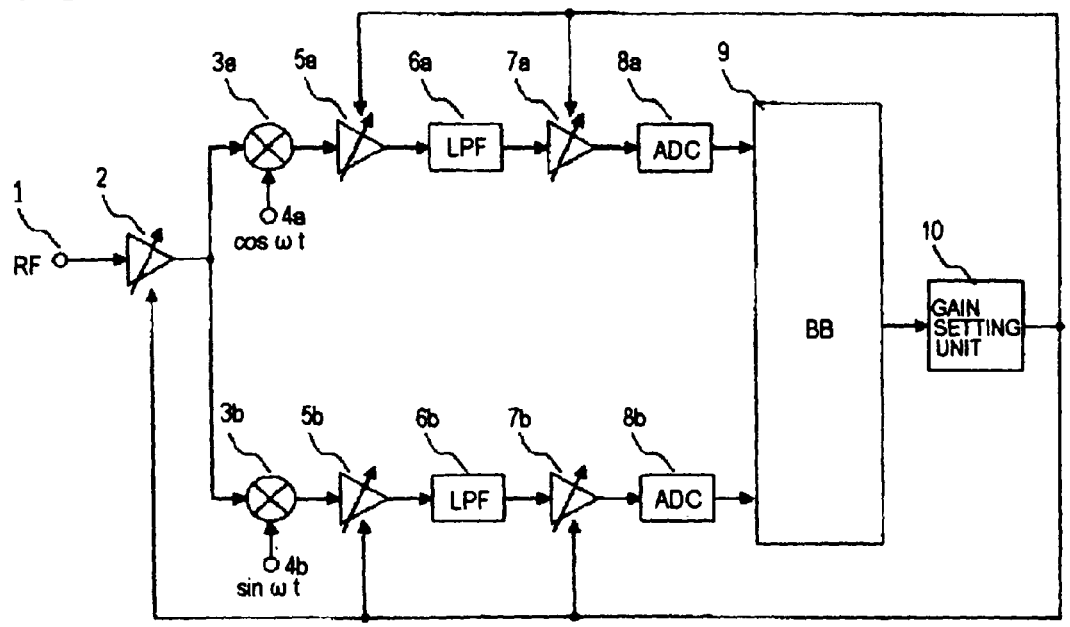
FIG. 1 is a block diagram showing a configuration of a conventional common direct conversion receiver.
Figure 2:
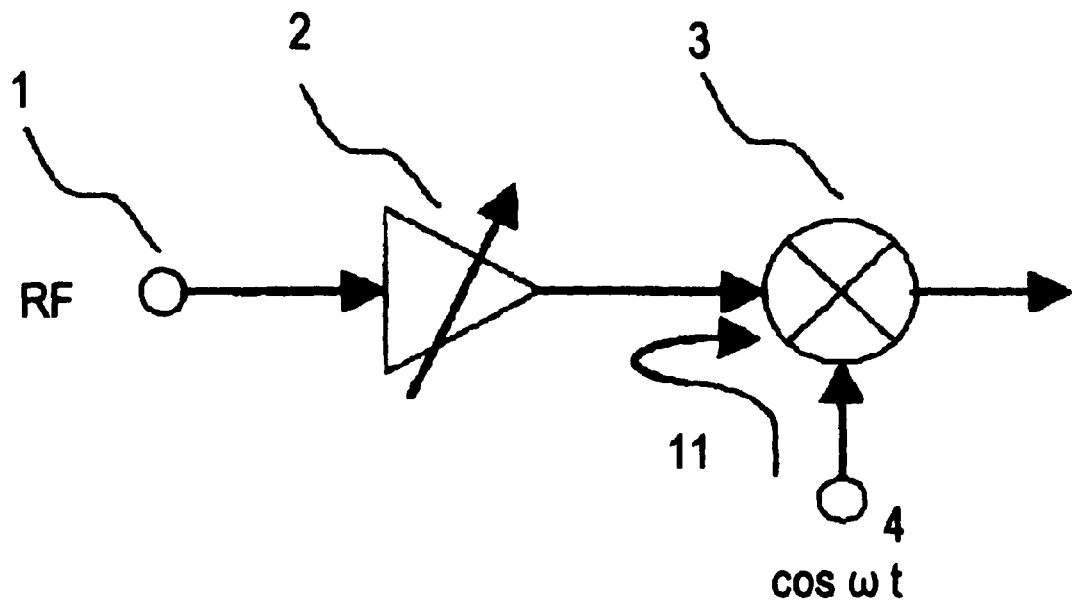
FIG. 2 is a diagram explaining an example of a mechanism by which a DC offset is generated in a conventional signal processing device.
Figure 3:
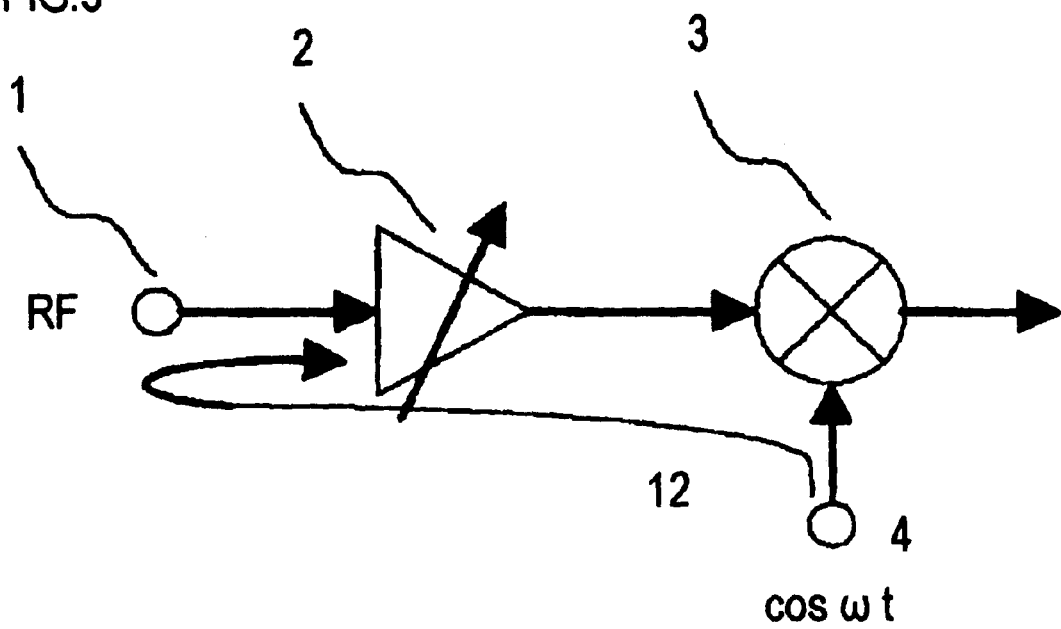
FIG. 3 is a diagram explaining another mechanism by which a DC offset is generated in the conventional signal processing device.
Figure 4:
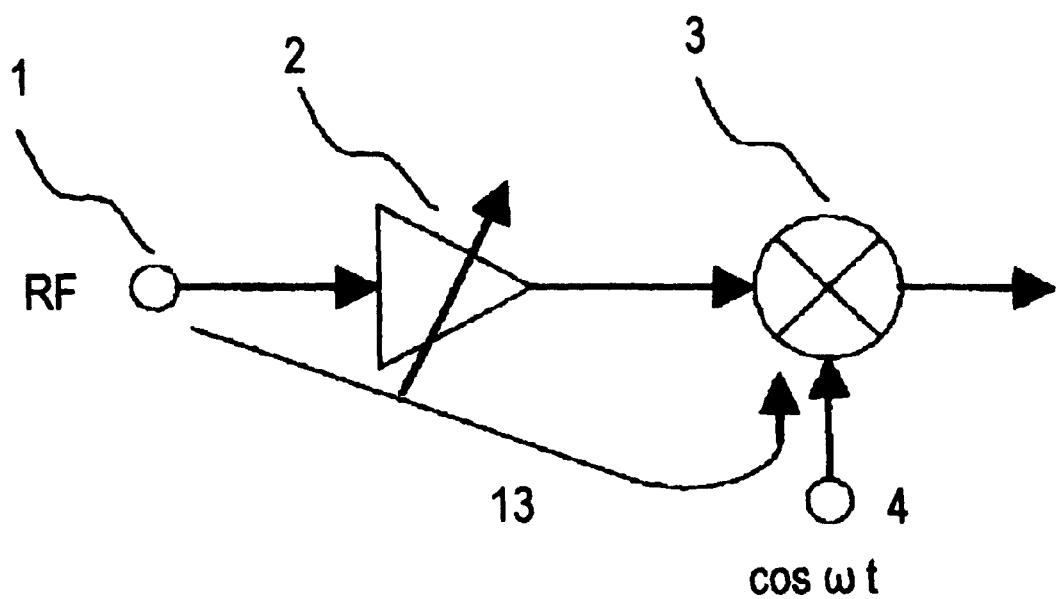
FIG. 4 is a diagram explaining a still another mechanism by which a DC offset is generated in the conventional signal processing device.
Figure 5:
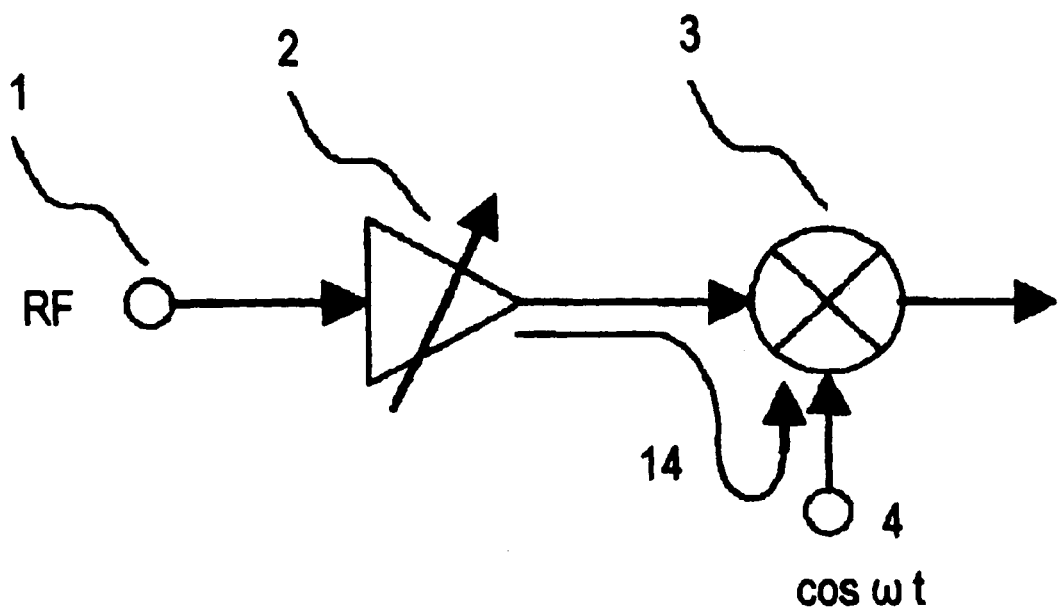
FIG. 5 is a diagram explaining yet another mechanism by which a DC offset is generated in the conventional signal processing device.

Exemplary modes of the present invention will be described with reference to drawings.

A signal processing device according to an exemplary mode of the present invention is configured to include an input terminal (such as an input terminal 29) that receives an input signal, an amplifier (such as a gain amplifier 31) that amplifies the input signal to generate an output signal, an output terminal (such as an output terminal 30) that outputs the output signal, comparators (such as comparators 32 and 33) each of which compares a level of the output signal with a reference value, a capacitor (such as a capacitor 37), and a charger/discharger (composed of current source circuits 34 and 35, for example) that charges or discharges electric charges stored in the capacitor according to results of comparisons by the comparators when the level of the output signal falls outside a reference range, a variable current source (such as a variable current source 36) through which current to be flown is controlled by a potential at the capacitor, and a load circuit (such as a load circuit 38, 39, or 40) that is connected between the input terminal and the variable current source and supplies a bias to the input terminal, together with the variable current source.

According to the configuration described above, when the level of the output signal falls outside the reference range, the input terminal can be biased so that the level of the output signal falls within the reference range. On the other hand, when the level of the output signal falls within the reference range, charging or discharging by the charger/discharger is not performed. Thus, the current that flows through the variable current source is constant, and the bias to be supplied to the input terminal also becomes constant. Accordingly, omission of a DC component of the input signal does not occur.

First Exemplary Embodiment

Figure 8:
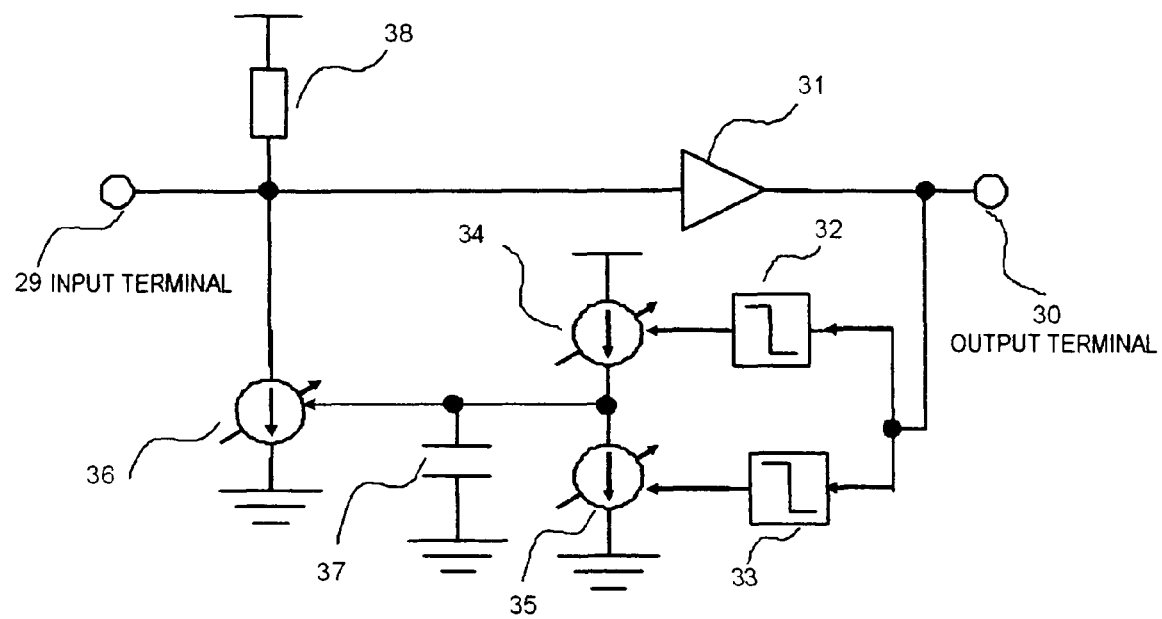
FIG. 8 is a diagram showing a configuration of a signal processing device in an exemplary embodiment.

FIG. 8 is a diagram showing a configuration of a signal processing device in a first exemplary embodiment. The signal processing device in this exemplary embodiment is configured by including a gain amplifier 31, comparators 32 and 33, current source circuits 34 and 35, a variable current source 36, a capacitor 37, and a load circuit 38. An input terminal 29 of the signal processing device is connected to an input of the gain amplifier 31, and an output of the gain amplifier 31 is connected to an output terminal 30 of the signal processing device. The output of the gain amplifier 31 is connected to comparison signal input terminals of the comparators 32 and 33 as well. Outputs of the comparators 32 and 33 are respectively connected to current control terminals of the current source circuits 34 and 35. The current source circuits 34 and 35 are connected in series between a power supply and the ground. A connecting point between the current source circuits 34 and 35 is connected to a current control terminal of the variable current source 36 and one end of the capacitor 37. The other end of the capacitor 37 is connected to the ground. The variable current source 36 is provided between the ground and the load circuit 38. The load circuit 38 is connected to the input terminal 29 and the power supply as well.

Figure 9:
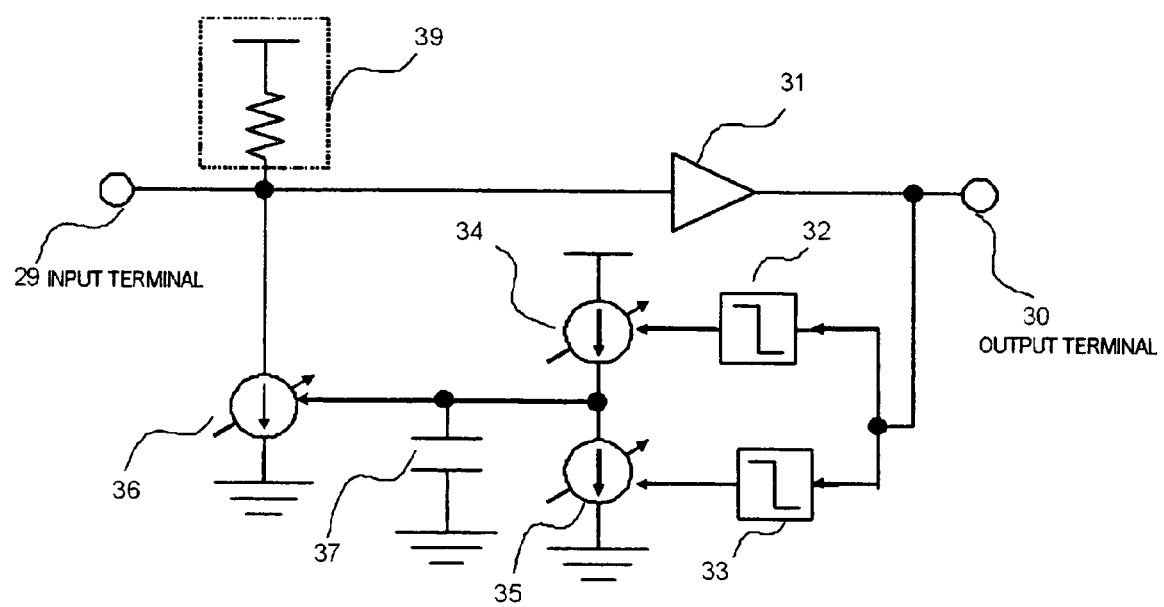
FIG. 9 is a diagram showing an example of a load circuit in the exemplary embodiment.
Figure 10:
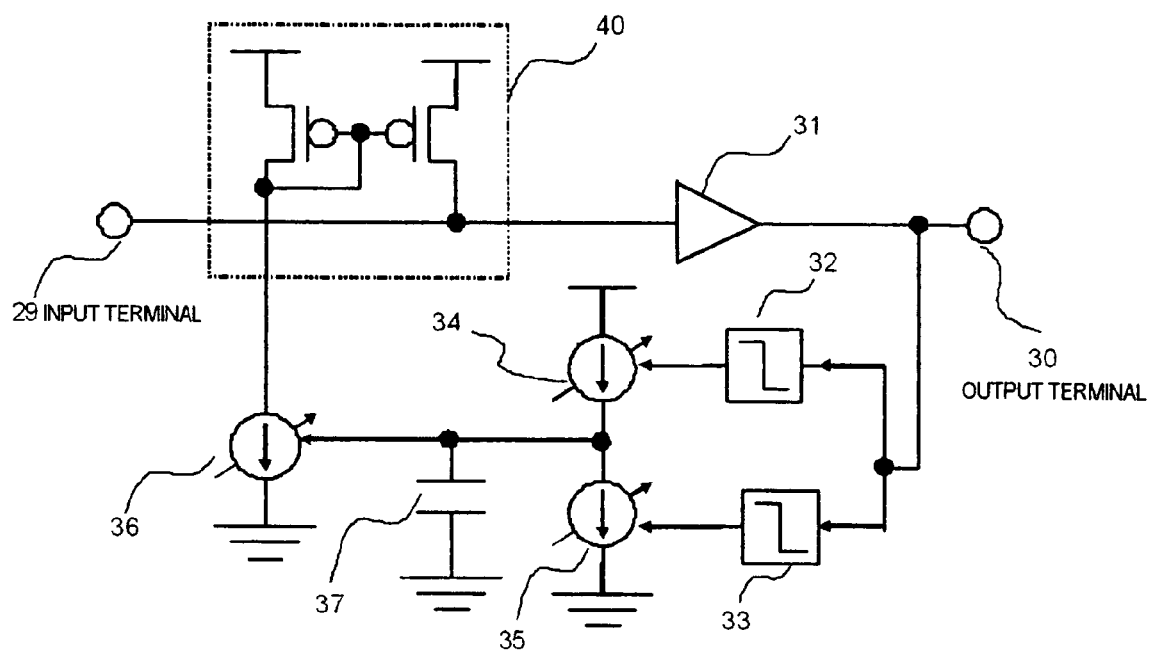
FIG. 10 is a diagram showing another example of the load circuit in the exemplary embodiment.
Figure 11:
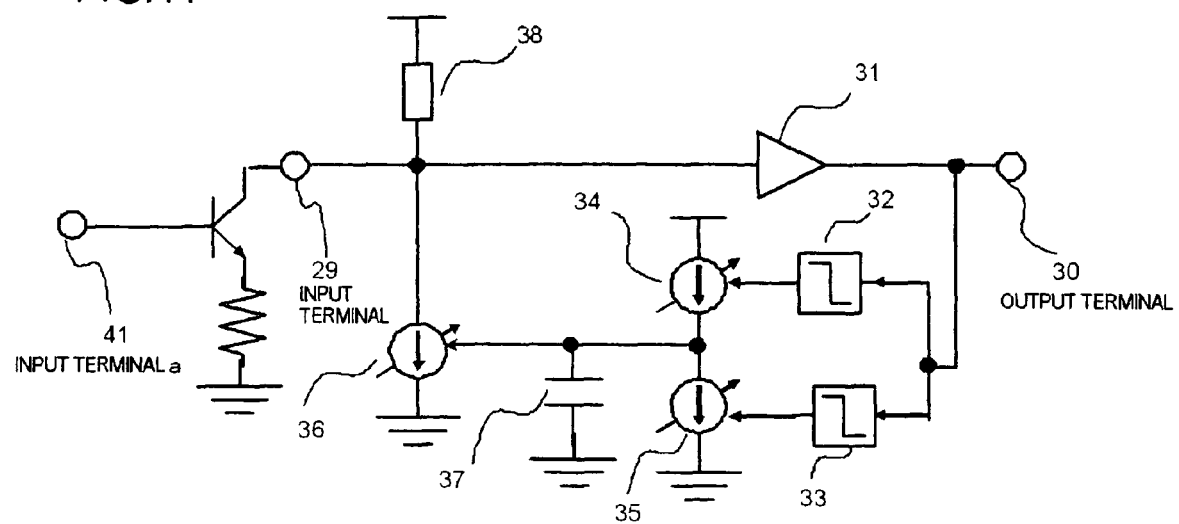
FIG. 11 is a diagram showing an example of an input circuit in the exemplary embodiment.

Specifically, the load circuit 38 may be a resistance load 39 as shown in FIG. 9, or a transistor load such as a current mirror circuit 40 in FIG. 10. When an output impedance of a preceding-stage circuit connected to the input terminal 29 is sufficiently lower than an impedance of the load circuit 38, bias control by the variable current source 36 and the load circuit 38 is difficult to exhibit a sufficient effect. In such a case, it may be so arranged that by adding a collector output circuit as shown in FIG. 11 to a stage preceding the input terminal 29, the impedance is increased to operate the signal processing device. In this case, a baseband signal is supplied from an input terminal a41.

Figure 12:
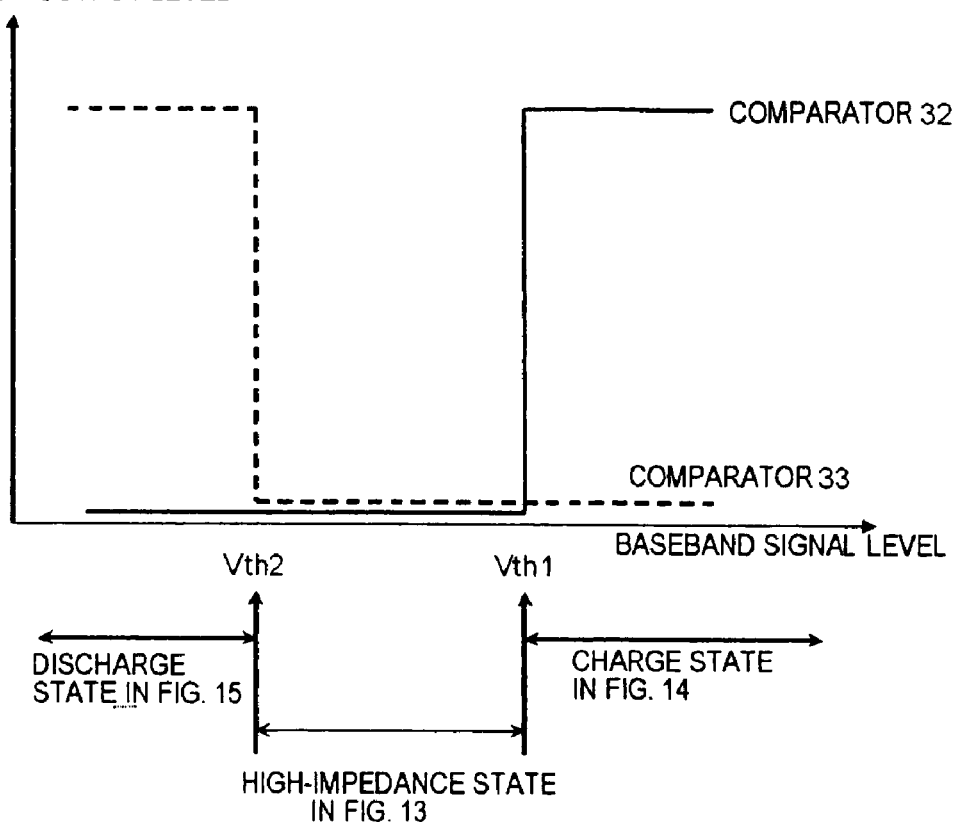
FIG. 12 is a graph showing input and output characteristics of comparators in the exemplary embodiment.

Next, an operation of the first exemplary embodiment will be described. Referring to FIG. 8, the baseband signal is supplied from the input terminal 29, and is then amplified to a desired level by the gain amplifier 31. The amplified baseband signal is branched at an output terminal of the gain amplifier 31. One of the branched signals is output from the output terminal 30, and the other of the branched signals is supplied to the comparators 32 and 33. Since a threshold level Vth1 is set in the comparator 32 in advance and a threshold level Vth2 is set in the comparator 33 in advance, each of the comparators 32 and 33 compares the level of the baseband signal with the set threshold level, and outputs a "high-level signal" and a "low-level signal" according to a result of the comparison. Signals output from the comparators 32 and 33 are supplied to the control terminals of the current source circuits 34 and 35. As shown in FIG. 12, each of the current source circuits 34 and 35 assumes one of three types of states, which are "a state of charging electric charges into the capacitor 37", "a state of discharging electric charges from the capacitor 37", and "a high-impedance state" according to a combination of the "high-level signal" and the "low-level signal" supplied to the current source circuits 34 and 35. In this case, a voltage variation associated with electric charge charging/discharging is generated between terminals of the capacitor 37. The voltage variation controls the variable current source 36 in the form of a control voltage. According to the control voltage, the variable current source 36 flows current. By the variable current source 36, the current flows from the power supply through the load circuit 38. A DC potential at the input terminal 29 is determined by a voltage drop caused by the load circuit 38 connected to the power supply and a current value of the variable current source 36.

Next, a description will be given about operations of the exemplary embodiment when the level of the baseband signal output from the gain amplifier 31 is "within a range from a threshold Vth2 to a threshold Vth1", when the level of the baseband signal is "higher than the threshold level Vth1", and when the level of the baseband signal is "lower than the threshold level Vth2", as compared with the thresholds of the comparators 32 and 33 which have been set.

Figure 13:
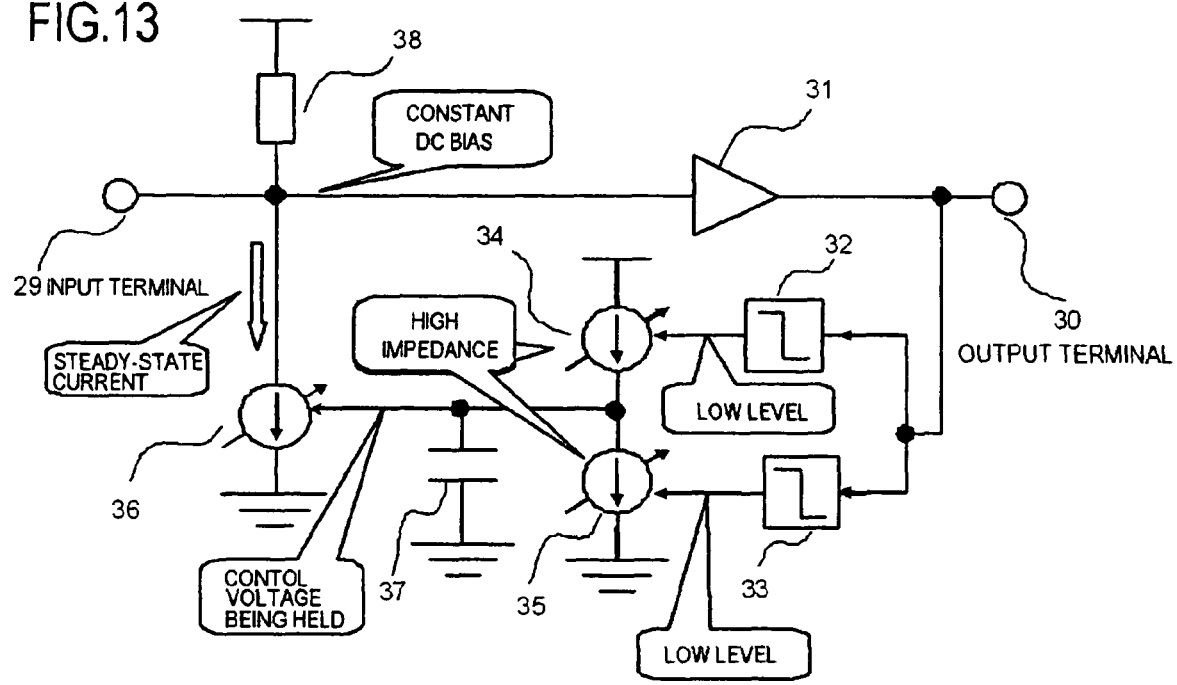
FIG. 13 is a diagram explaining an operation when there is no DC offset in the exemplary embodiment.

FIG. 13 shows a circuit operation when the level of the output signal of the gain amplifier 31 is "within the range from the threshold Vth2 to the threshold Vth1". When the output signal is within the range from the threshold Vth2 to the threshold Vth1, both of the comparators 32 and 33 output "low-level signals". The current source circuits 34 and 35 that have received the "low-level signals" assume the "high-impedance state".

In this case, electric charges are held in the capacitor 37. Thus, a voltage is generated between the terminals of the capacitor 37. This voltage serves as the control voltage for the variable current source 36, and the current is drawn from the power supply through the load circuit 38. The DC potential at the input terminal 29 is determined by a value of the voltage drop caused by this current and the load circuit 38. This DC potential stabilizes an output DC potential of the gain amplifier 31 at a desired value.

Figure 14:
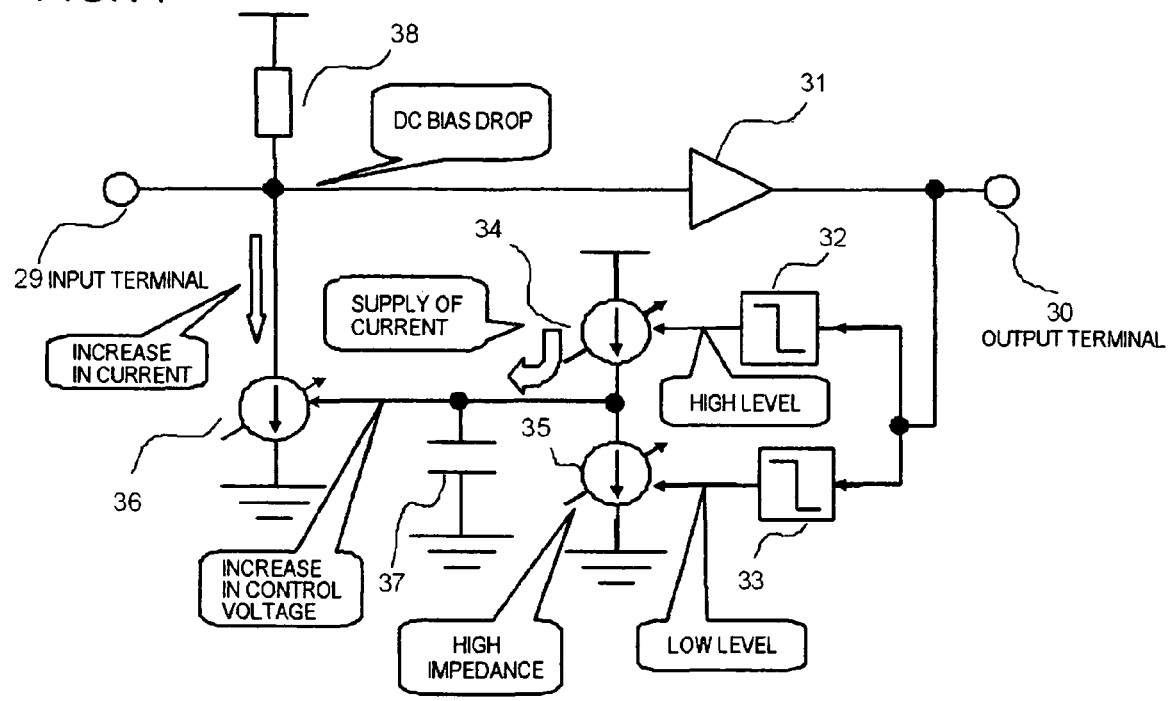
FIG. 14 is a diagram explaining an operation when there is a positive DC offset in the exemplary embodiment.

Next, FIG. 14 shows a circuit operation when the level of the output signal of the gain amplifier 31 is "higher than the threshold level Vth1". When an amount of DC offset of the baseband signal output from the gain amplifier 31 is higher than the threshold level Vth1, the comparator 32 outputs the "high-level signal", and the comparator 33 outputs the "low-level signal". The current source circuit 34 that has received the "high-level signal" assumes the "state of charging the capacitor 37". The current source circuit 35 that has received the "low-level signal" assumes the "high-impedance state". Since the current source circuit 34 assumes the "state of charging the capacitor 37", a terminal voltage at the capacitor 37 is increased. This increase in the voltage increases an amount of current drawn by the variable current source 36 in the form of the control voltage for the variable current source 36. When the amount of the current of the variable current source 36 is increased, a voltage drop generated at the load circuit 38 is increased. The DC potential at the input terminal 29 is thereby reduced. Reduction of the DC potential at the input terminal 29 causes the DC potential output from the gain amplifier 31 as well to be reduced. The amount of DC offset can be thereby suppressed.

Figure 15:
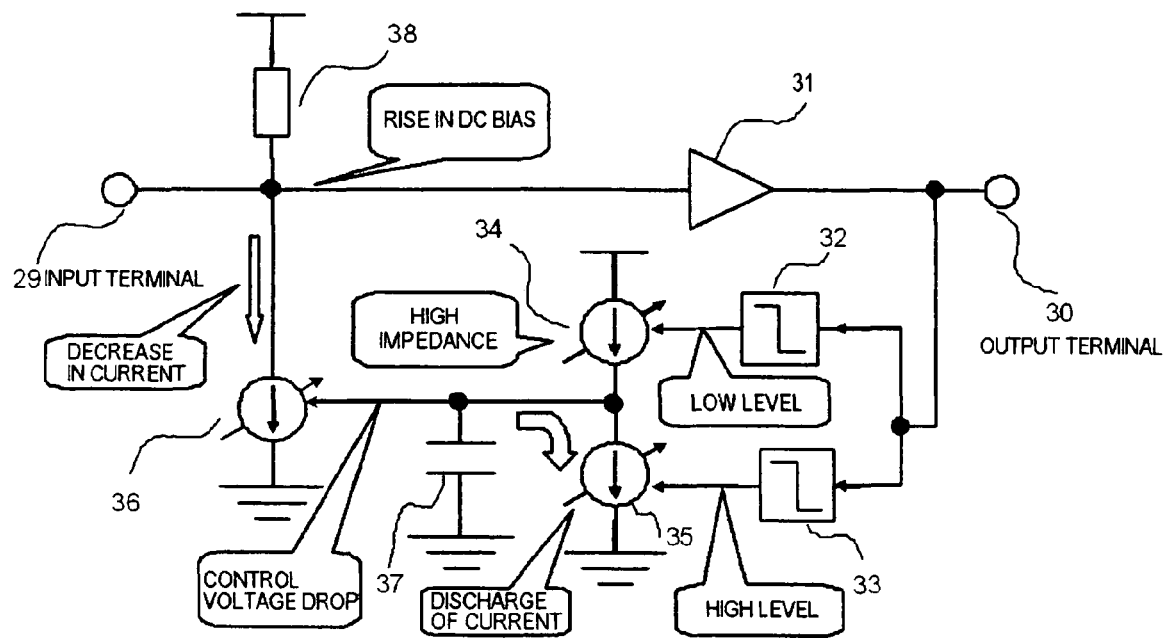
FIG. 15 is a diagram explaining an operation when there is a negative DC offset in the exemplary embodiment.

Next, FIG. 15 shows a circuit operation when the level of the output signal of the gain amplifier 31 is "lower than the threshold level Vth2". When the amount of DC offset of the baseband signal output from the gain amplifier 31 is lower than the threshold level Vth2, the comparator 32 outputs the "low-level signal", and the comparator 33 outputs the "high-level signal". The current source circuit 34 that has received the "low-level signal" assumes the "high-impedance state". The current source circuit 35 that has received the "high-level signal" assumes the "state of discharging the capacitor 37". Since the current source circuit 35 assumes the "state of discharging the capacitor 37", the terminal voltage at the capacitor 37 is dropped. This drop in the voltage drop reduces the amount of the current drawn by the variable current source 36 as the control voltage for the variable current source 36. When the amount of the current drawn by the variable current source 36 is reduced, a voltage drop generated at the load circuit 38 is reduced, so that the DC potential at the input terminal 29 is increased. An increase in the DC potential at the input terminal 29 causes the DC potential output from the gain amplifier 31 as well to be increased. The amount of DC offset can be thereby suppressed.

Operations of the comparators 32 and 33 descried above are summarized as follows. When the level of the output signal of the gain amplifier 31 exceeds the threshold level Vth1, the comparator 32 outputs the "high-level signal" to the current source circuit 34 as an overlevel signal. The charger/discharger composed of the current source circuits 34 and 35 charges the capacitor. When the level of the output signal of the gain amplifier 31 falls below the threshold level Vth2, the comparator 33 outputs the "high-level signal" to the current source circuit 35 as an underlevel signal. The charger/discharger composed of the current source circuits 34 and 35 performs discharging of electric charges stored in the capacitor. When the level of the output signal of the gain amplifier 31 is within the range from the threshold Vth2 to the threshold Vth1, the charger/discharger does not perform charging/discharging, and the capacitor holds electric charges. The variable current source 36 flows current based on an amount of the electric charges (potential) accumulated in the capacitor, thereby supplying a constant bias to the input terminal, together with the load circuit. The level of the output signal of the gain amplifier is also varied according to the bias supplied to the input terminal. Due to the operations described above, the entire circuit can be stabilized at a desired DC potential, so that an amount of DC offset can be thereby suppressed.

In this exemplary embodiment, the variable current source 36 is connected to the ground, and the load circuit 38 (or 39, or 40) is connected to the power supply. Even when the variable current source 36 is connected to the power supply and the load circuit 38 (or 39, or 40) is connected to the ground, a similar effect can be obtained.

Figure 6:
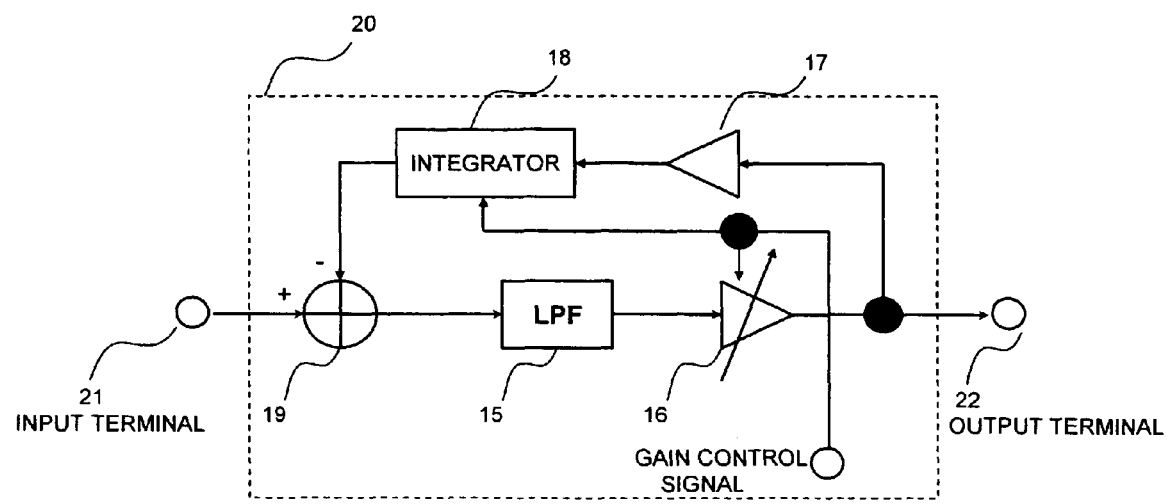
FIG. 6 is a diagram showing a configuration of a signal processing device described in Patent Document 1.

In the exemplary embodiment described above, baseband signal components are used for threshold level determinations at the comparators 32 and 33 alone. Thus, baseband signal component omission generated in a circuit configuration using a negative feedback circuit shown in a prior art in FIG. 6 does not occur.

When the baseband signal is in a steady state, the current source circuits 34 and 35 assume the "high-impedance state" in the operation in the above-mentioned exemplary embodiment. Thus, neither charging nor discharging is performed. A voltage generated between the terminals of the capacitor 37 is held, and no noise caused by the current source circuits 34 and 35 is created. Accordingly, a possibility that the noise is mixed into the signal is also small.

Figure 7:
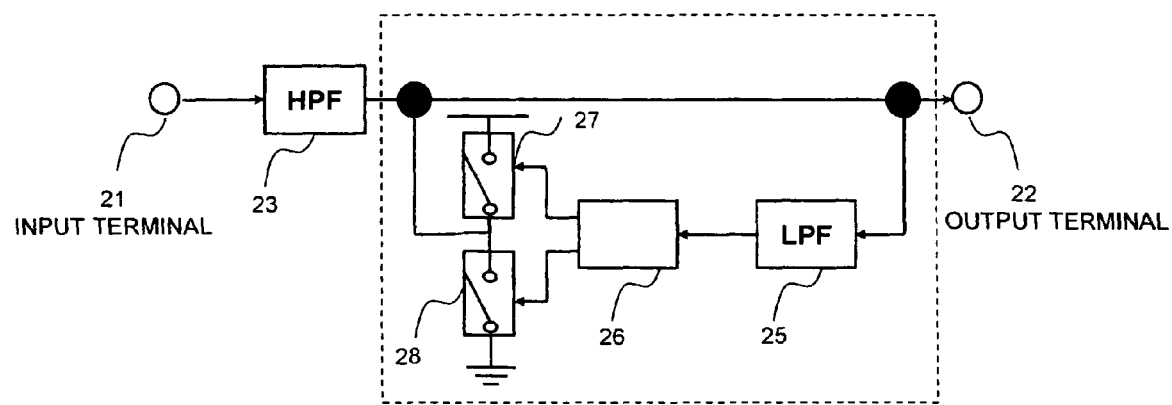
FIG. 7 is a diagram showing a configuration of a signal processing device described in Patent Document 2.

Further, in the case of a circuit configuration that uses an HPF 23 as in a prior art in FIG. 7, in order to pass the signal beginning with its low-frequency component, the chip area is increased. In the circuit configuration of the exemplary embodiment, however, there is no HPF. Thus, components of the baseband signal in the vicinity of a DC component can be passed. The chip area can also be reduced.

That is, according to the exemplary embodiment described above, comparisons of the signal level of the baseband signal are made using the comparators. Then, the control voltage held in the capacitor for the variable current source that compensates for a DC offset is varied, based on results of the comparisons. Accordingly, there is no need for negatively feeding back the baseband signal itself. Noise on the baseband signal caused by a circuit for the negative feedback can be thereby suppressed. The NF of the entire circuit is not therefore deteriorated. Further, since the circuit is configured not to use the HPF, there is no deterioration in the vicinity of the DC component of the baseband signal. The baseband signal components can be transmitted with no omission. The chip area can also be reduced.

Second Exemplary Embodiment

When a burst-like disturbance is applied through the input terminal 29 in FIG. 8, the exemplary embodiment shown in FIG. 8 operates to compensate for an amount of DC offset, according to the disturbance. As a result, the amount of DC offset when the disturbance is eliminated may become large, so that amplification of the baseband signal may not be able to be performed.

Figure 16:
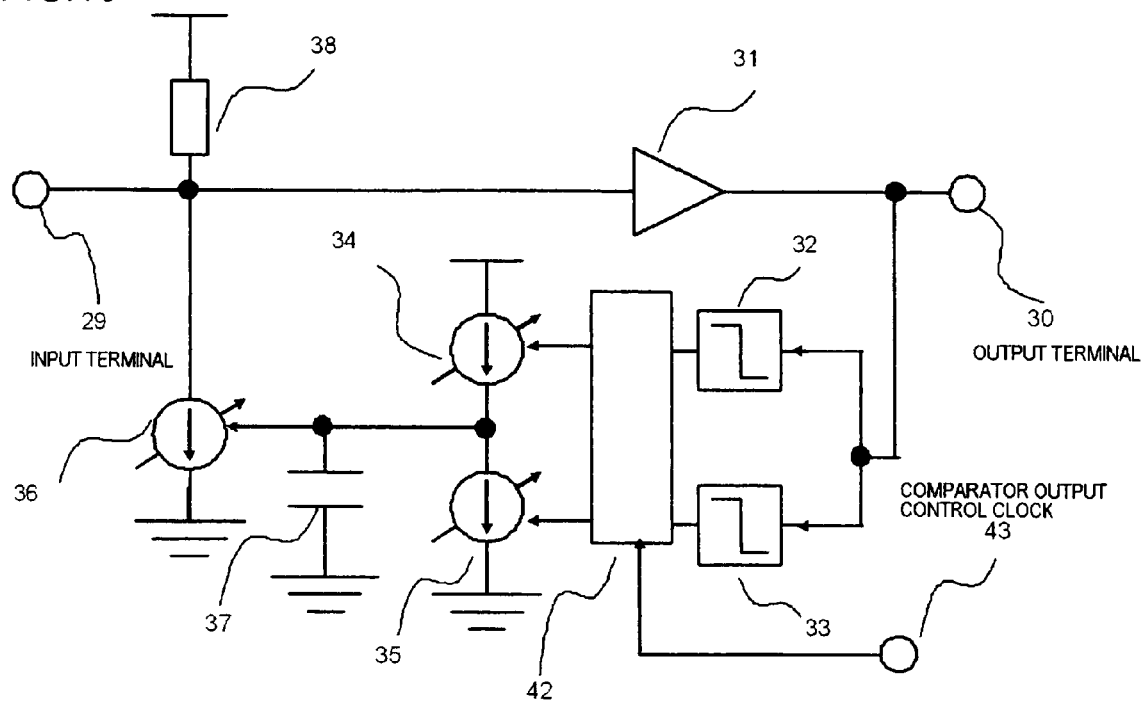
FIG. 16 is a diagram showing a configuration of a signal processing device in a second exemplary embodiment.

Then, in a second exemplary embodiment shown in FIG. 16, control over the current source circuits 34 and 35 by the comparators 32 and 33 that is effective only for a time set to arbitrary times of a comparator output control clock 43 is performed. A period in which a DC offset cancelling circuit is operated can be thereby controlled. With this arrangement, an amount of DC offset can be suppressed without always causing the DC offset cancelling circuit to respond to a disturbance, and amplification of the baseband signal can be performed. Referring to FIG. 16, to components that are the same as those in the first exemplary embodiment in terms of structure and operation, same reference numerals as those in FIG. 8 are assigned. Descriptions of the components are thereby omitted.

Figure 17:
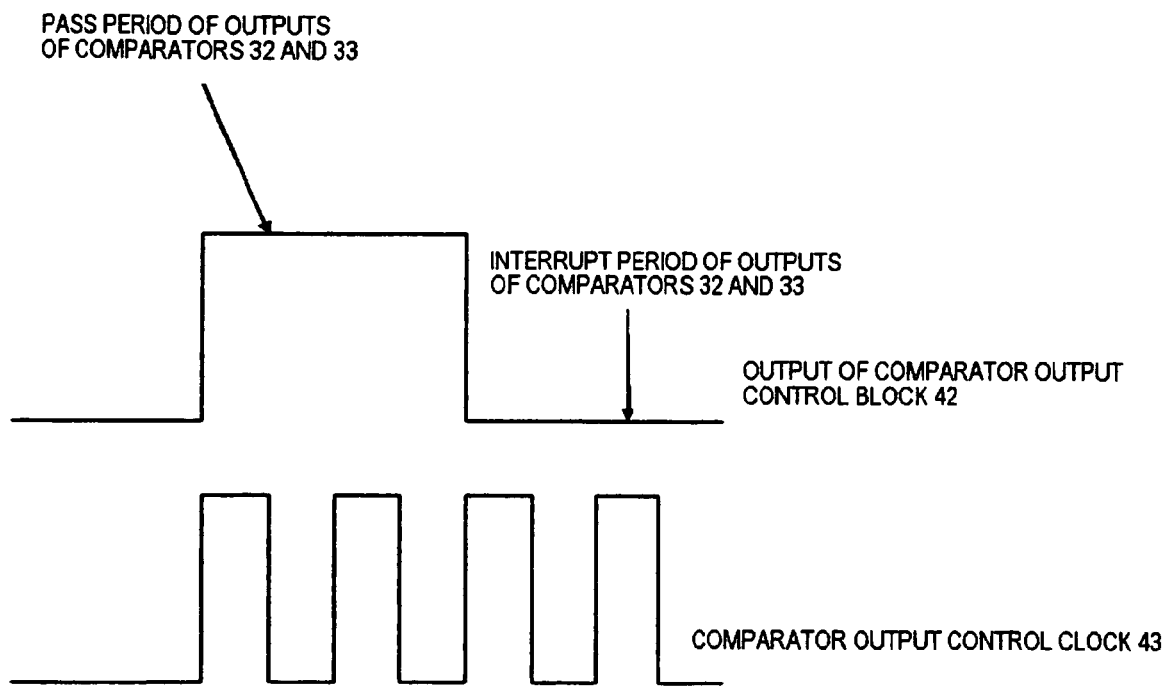
FIG. 17 is a timing chart explaining an operation in the second exemplary embodiment.

In this exemplary embodiment, a comparator output control block 42 includes inside a counter that counts the comparator output control clock 43. The comparator output control block 42 can thereby repeat each of a period in which signals output from the comparators 32 and 33 are transmitted to the current source circuits 34 and 35 without alteration to adjust a DC offset and a period in which, even when one of the comparators 32 and 33 outputs a "high-level signal", the comparator output control block 42 forcibly outputs "low-level signals" to hold electric charges in the capacitor and suspend DC offset adjustment, for every count of a predetermined number of the clocks. Referring to a timing chart shown in FIG. 17, for every count of two of the comparator output control clocks 43, each of an operation of transmitting outputs of the comparators 32 and 33 to the current source circuits 34 and 35 without alteration and an operation of interrupting the outputs of the comparators 32 and 33 is repeated.

In this exemplary embodiment, a presettable counter may be used as the counter. Then, using a microcomputer or a digital circuit that controls the entire system, a period in which DC offset adjustment is performed and a period in which the DC offset adjustment is suspended may be freely set. Sensitivity of the DC offset adjustment may be thereby adjusted.

Third Exemplary Embodiment

Figure 18:
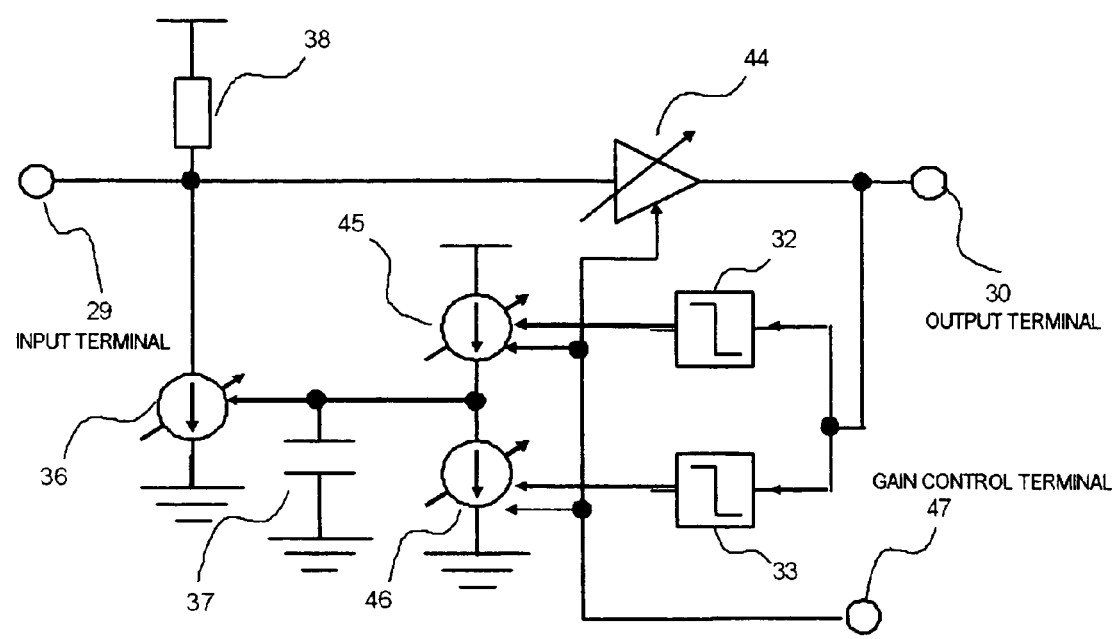
FIG. 18 is a diagram showing a configuration of a signal processing device in a third exemplary embodiment.

FIG. 18 shows a configuration diagram of a third exemplary embodiment. Referring to FIG. 18, to components that are the same as those in the first exemplary embodiment in terms of structure and operation, same reference numerals as those in FIG. 8 are assigned. Descriptions of the components are thereby omitted. In this configuration, the gain amplifier 31 in the first exemplary embodiment (in FIG. 8) is replaced by a variable gain amplifier 44, and the current source circuits 34 and 35 are replaced by current-amount control type variable current source circuits 45 and 46. A gain of the variable gain amplifier 44 and current amounts of the current-amount control type variable current source circuits 45 and 46 are controlled by a gain control terminal 47. When the gain of the variable gain amplifier 44 is large, currents of the current-amount control type variable current source circuits 45 and 46 are reduced. When the gain of the variable gain amplifier 44 is small, the currents of the current-amount control type variable current source circuits 45 and 46 are increased. By exercising the control as described above, a period of time taken for suppressing an amount of DC offset in a baseband signal can always be made constant.

Fourth Exemplary Embodiment

Figure 19:
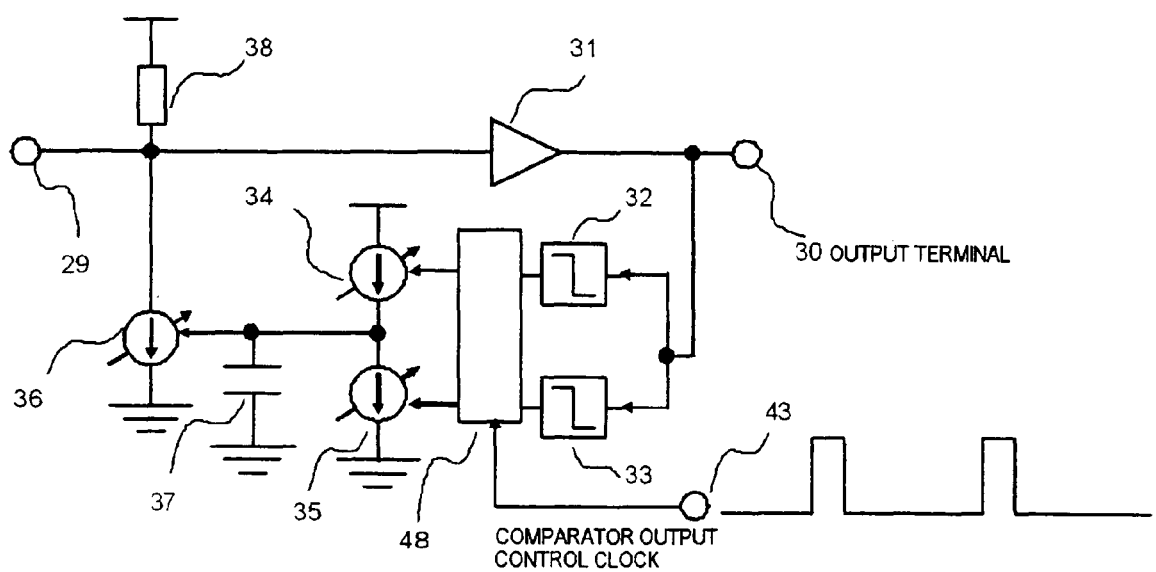
FIG. 19 is a diagram showing a configuration and an operation of a signal processing device in a fourth exemplary embodiment.

FIG. 19 shows a configuration diagram of a fourth exemplary embodiment. Referring to FIG. 19, to components that are the same as those in the first exemplary embodiment in terms of structure and operation, same reference numerals as those in FIG. 8 are assigned. Descriptions of the components are thereby omitted. In FIG. 19, a comparator output control block 48 is added between outputs of the comparators 32 and 33 and inputs to the current source circuits 34 and 35 in the configuration diagram of the first exemplary embodiment shown in FIG. 8. The comparator output control block 48 is a block in which when a comparator output control clock 43 is high, the outputs of the comparators 32 and 33 are passed, and when the comparator output control clock 43 is low, the outputs of the comparators 32 and 33 are interrupted, thereby setting the current source circuits 34 and 35 to a "high-impedance state".

With this arrangement, an operation state and a standby state are present in a DC offset cancelling circuit. When a baseband signal is in a steady state, the DC offset cancelling circuit does not need to operate. Thus, by suppressing an amount of DC offset for every arbitrary period, the baseband signal is amplified with no problem.

By optimally adjusting a duty ratio between the high level and the low level of the comparator output control clock 43, the DC offset cancelling circuit can be operated while reducing power consumption for the DC offset. In the second exemplary embodiment, the counter is needed to be provided inside the comparator output control block 42. In this fourth exemplary embodiment, however, there is no need for providing the counter inside the comparator output control block 48. By changing the frequency and duty ratio of the comparator output control block 48, the signal processing device can be freely controlled, and the DC offset can be adjusted.

Fifth Exemplary Embodiment

Figure 20:
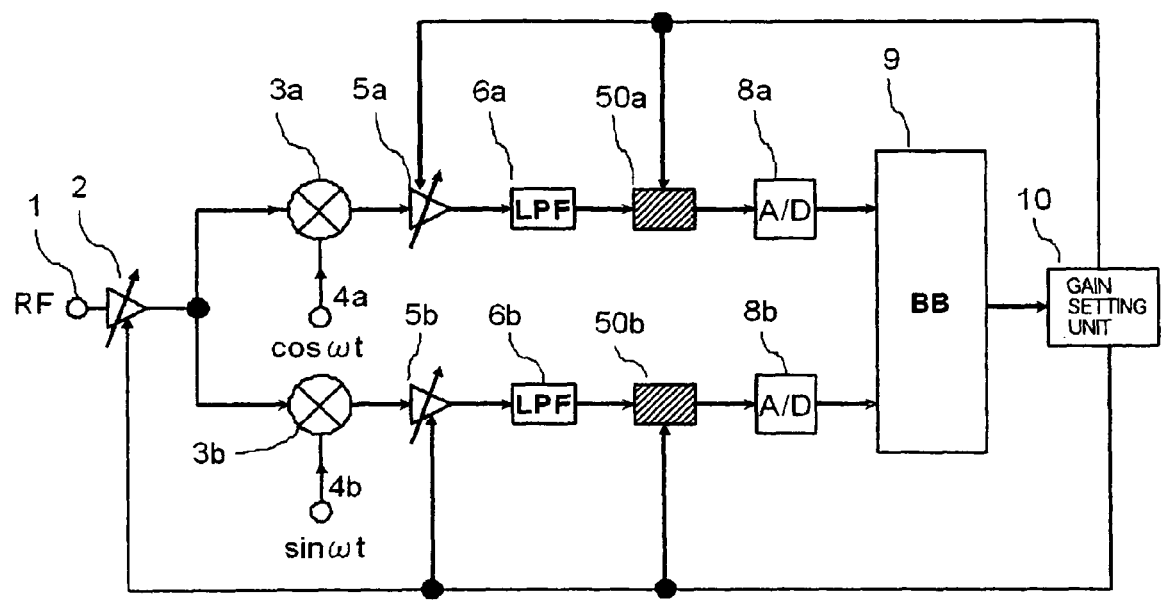
FIG. 20 is a block diagram in a fifth exemplary embodiment in which the signal processing device is used in a receiver in a direct conversion system.

Next, an exemplary embodiment in which the signal processing device is used for a direct conversion receiver will be described. FIG. 20 is a block diagram showing the exemplary embodiment. Referring to FIG. 20, to components that are substantially the same as those in a the conventional direct conversion receiver in FIG. 1, same reference numerals are assigned. Then, descriptions of the components will also be thereby omitted. In FIG. 1, the gain variable amplifiers 7a and 7b are connected in a stage after the low-pass filters 6a and 6b. In this exemplary embodiment, signal processing devices 50a and 50b are connected, in place of the gain variable amplifiers 7a and 7b. As each of the signal processing devices 50a and 50b, the signal processing device in the third exemplary embodiment in FIG. 18 may be employed without alteration. Outputs of the low-pass filters 6a and 6b are connected to the input terminal 29 in FIG. 18. The output terminal 30 in FIG. 18 is connected to the A/D converters 8a and 8b. A gain control signal output from the gain control unit (gain setting unit) 10 is connected to the gain control terminal 47 of the signal processing device in FIG. 18.

In this exemplary embodiment, when there is no need for performing gain setting inside the signal processing devices 50a and 50b, the signal processing device in each of the first, second, and fourth exemplary embodiment may be used as each of the signal processing devices 50a and 50b. Locations where the signal processing devices 50a and 50b are arranged may be set anywhere in the receiver after down-conversion has been performed by the down-conversion mixers 3a and 3b and before conversion to digital signals is performed by the analog-to-digital converters 8a and 8b.

In the above description was given in connection with the exemplary embodiments. The present invention is not limited to the configurations of the above-mentioned exemplary embodiments alone, and of course includes various variations and modifications that could be made by those skilled in the art within the scope of the present invention.

The second or fourth exemplary embodiment may be arbitrarily combined with the third exemplary embodiment, for example.

In the exemplary embodiments described above, the gain amplifier 31 is a non-inverting amplifier of which an input and an output are in phase. Further, the variable current source 36 is a variable current source in which when a voltage applied to the current control terminal is increased, current is also increased. The gain amplifier 31 and the variable current source 36 are not limited to these configurations. In short, the signal processing device should be a control system in which, when the level of an output signal falls outside a reference range, negative feedback is applied so that the level of the output signal is returned to the reference range. Even if the gain amplifier is an inverting amplifier and even if the variable current source is a variable current source in which when a voltage applied to the current control terminal of the variable current source is dropped, current is increased, such a gain amplifier and such a variable current source can be applied, by interchanging connections of the comparators and the charger/discharger, for example.

Further, the capacitor is not limited to the one provided between the signal processing circuit and the ground. Needless to say, the capacitor may be provided between the signal processing circuit and other fixed potential, for example.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A signal processing device comprising:
   an input terminal that receives an input signal;
   an amplifier that amplifies the input signal to generate an output signal;
   a comparator that compares a level of the output signal with a reference value;
   a capacitor;
   a charger/discharger that charges or discharges electric charges stored in the capacitor according to a result of the comparison by the comparator when the level of the output signal falls outside a reference range;
   a variable current source through which current to be flown is controlled according to a potential at the capacitor; and
   a load circuit that is connected between the input terminal and the variable current source and supplies a bias to the input terminal, together with the variable current source.

2. The signal processing device according to claim 1, wherein
   the comparator comprises:
   a first comparator that compares the voltage level of the output signal with a first reference voltage and outputs an overlevel signal when the voltage level of the output signal is higher than the first reference voltage; and
   a second comparator that compares the voltage level of the output signal with a second reference voltage which is lower than the first reference voltage, and outputs an underlevel signal when the voltage level of the output signal is lower than the second reference voltage; and
   said charger/discharger comprises:
   a first current source circuit that charges the capacitor upon receipt of one of the overlevel signal and the underlevel signal; and
   a second current source circuit that discharges the capacitor upon receipt of the other of the overlevel signal and the underlevel signal.

3. The signal processing device according to claim 1, wherein
   said charger/discharger further comprises:
   a comparator output control unit that controls whether or not to perform charging/discharging by the charger/discharger according to the result of the comparison by the comparator; and
   the comparator output control unit performs switching between a state where the charging/discharging is performed according to the result of the comparison and a state where the charging/discharging is not performed even if the level of the output signal falls outside the reference range, based on a control clock.

4. The signal processing device according to claim 3, wherein
   said comparator output control unit counts the control clock, and switches whether or not to perform the charging/discharging by the charger/discharger, based on a counted value of the control clock.

5. The signal processing device according to claim 3, wherein
   said comparator output control unit switches whether to not to perform the charging/discharging by said charger/discharger according to a logic level of the control clock.

6. The signal processing device according to claim 2, wherein
   said amplifier is a variable gain amplifier, the first and second current source circuits are both current-amount control type variable current source circuits with current amounts thereof controlled in response to a gain control signal of the variable gain amplifier.

7. A signal processing device used in a direct conversion receiver for amplification of a baseband signal obtained after mixing of a received signal with a local signal, comprising:
   an input terminal that receives a baseband signal;
   an amplifier that amplifies the baseband signal to generate an output signal;
   a comparator that compares a level of the output signal with a reference value;
   a capacitor;
   a charger/discharger that charges or discharges electric charges stored in the capacitor according to a result of the comparison by the comparator when the level of the output signal falls outside a reference range;
   a variable current source through which current to be flown is controlled according to a potential at the capacitor; and
   a load circuit that is connected between the input terminal and the variable current source and supplies a bias to the input terminal, together with the variable current source, wherein
   the output signal is converted to a digital signal and is connected to a baseband signal processing unit of a direct conversion receiver.

8. The signal processing device according to claim 7, wherein
   said comparator comprises:
   a first comparator that compares the voltage level of the output signal with a first reference voltage and outputs an overlevel signal when the voltage level of the output signal is higher than the first reference voltage; and
   a second comparator that compares the voltage level of the output signal with a second reference voltage which is lower than the first reference voltage, and outputs an underlevel signal when the voltage level of the output signal is lower than the second reference voltage; and
   said charger/discharger comprises:
   a first current source circuit that charges the capacitor upon receipt of one of the overlevel signal and the underlevel signal; and
   a second current source circuit that discharges the capacitor upon receipt of the other of the overlevel signal and the underlevel signal.

9. The signal processing device according to claim 7, wherein
   said charger/discharger further comprises:
   a comparator output control unit that controls whether or not to perform charging/discharging by the charger/discharger according to the result of the comparison by the comparator; and
   said comparator output control unit performs switching between a state where the charging/discharging is performed according to the result of the comparison and a state where the charging/discharging is not performed even if the level of the output signal falls outside the reference range, based on a control clock.

10. The signal processing device according to claim 9, wherein said comparator output control unit counts the control clock, and switches whether or not to perform the charging/discharging by the charger/discharger, based on a counted value of the control clock.

11. The signal processing device according to claim 9, wherein
said comparator output control unit switches whether to not to perform the charging/discharging by the charger/discharger according to a logic level of the control clock.

12. The signal processing device according to claim 8, wherein
said amplifier is a variable gain amplifier, the first and second current source circuits are both current-amount control type variable current source circuits with current amounts thereof controlled in response to a gain control signal of the variable gain amplifier.

* * * * *